United States Patent [19]

Malota

[11] Patent Number: 5,495,214
[45] Date of Patent: Feb. 27, 1996

[54] METHOD AND APPARATUS FOR CONTROLLING THE OPERATING POINT OF AN AMPLIFIER STAGE

[75] Inventor: Bernhard Malota, Mönchweiler, Germany

[73] Assignee: Deutsche Thomson-Brandt GmbH, Villingen-Schwenningen, Germany

[21] Appl. No.: 261,067

[22] Filed: Jun. 16, 1994

[30] Foreign Application Priority Data

Jun. 16, 1993 [DE] Germany .................. 43 19 845.7

[51] Int. Cl.⁶ .................. H03F 3/30; H04N 5/00
[52] U.S. Cl. .................. 330/265; 330/270; 330/290; 348/707; 348/805
[58] Field of Search .................. 330/132, 265, 330/267, 270, 273, 290, 296; 348/707, 805, 806

[56] References Cited

U.S. PATENT DOCUMENTS

| | | | |
|---|---|---|---|
| 3,529,252 | 9/1970 | Long | 330/265 |
| 4,077,013 | 2/1978 | Morez et al. | 330/296 X |
| 4,468,630 | 8/1984 | Marukawa et al. | 330/132 X |
| 4,745,464 | 5/1988 | Gronau et al. | 358/34 |
| 5,235,288 | 8/1993 | Rinderle et al. | 330/264 |
| 5,282,039 | 1/1994 | Villard | 348/707 |

FOREIGN PATENT DOCUMENTS

| | | | |
|---|---|---|---|
| 0230924 | 8/1987 | European Pat. Off. | H04N 5/14 |
| 0380789 | 8/1990 | European Pat. Off. | H04N 5/14 |
| 4104980 | 8/1992 | Germany | H03F 3/42 |
| 1336796 | 4/1992 | U.S.S.R. | G06G 7/20 |
| 2178264A | 2/1987 | United Kingdom | H04N 5/14 |

OTHER PUBLICATIONS

Philips Data Sheet—TDA3505/TDA3506, Nov. 1987.

*Primary Examiner*—James B. Mullins
*Attorney, Agent, or Firm*—Joseph S. Tripoli; Peter M. Emanuel

[57] ABSTRACT

At high frequencies, a video amplifier draws a higher current and normally is biased to provide such current. However, since high frequencies are rarely encountered, the present circuit controls the operating point as a function of the frequency. More specifically, a controlled variable which controls the operating point of the amplifier stage is obtained in dependence on the frequency to which the amplifier stage is driven.

4 Claims, 6 Drawing Sheets

METHOD AND APPARATUS FOR CONTROLLING THE OPERATING POINT OF AN AMPLIFIER STAGE

FIELD OF THE INVENTION

The invention concerns a method and an apparatus for controlling the operating point of an amplifier stage and more particularly an output video amplifier stage.

BACKGROUND OF THE INVENTION

It is known that in the case of picture tubes which are driven by a high video signal amplitude, such as for example, projectors, the video amplifiers for driving the picture tubes are designed for relatively high supply voltages and output levels. A limit is created by the maximum voltage and temperature loading of the transistors. However, the video signals with the high frequency requirements on the output stage occur only in the rarest cases, such as for example in the case of frequency response measurements or special computer graphics. Therefore, designing the output stage for these relatively high loads tends to be detrimental in normal operation, since the power consumption and the generation of heat increase. The cause of this problem lies in the temperature dependence of the transistor on the frequency, since the current, and consequently the temperature, increase linearly at high frequencies.

Furthermore, the operating point of the video amplifier shifts at high levels of high-frequency signal output, and then low-frequency signal components are distorted when they are transmitted. In practice this has the effect that the return lines of the sweep circuits and various picture brightness defects with superimposed bar patterns or shades of grey are evident. An increasing of the quiescent current for the operating point of the video amplifier would indeed solve the problem, but would have the known power and temperature problems as a consequence.

Therefor, there is a need to for a video amplifier stage which provides a relatively distortion free display of video signals with little outlay on the components.

SUMMARY OF THE INVENTION

In accordance with the invention, the operating point of an amplifier stage is controlled with the aid of a controlled variable, which is obtained in dependence on the frequency output to which the amplifier stage is driven. In an embodiment of the invention, the amplifier stage is followed by an emitter follower, from the current path of which the controlled variable is obtained. With increasing frequency, as a physically dependent consequence, the reactive currents in the transistor of the emitter follower increase. As a result, the current in the current path of the emitter follower increases, and the voltage drop across a resistor in the current path of the emitter follower increases. The controlled variable thus obtained is rectified and/or filtered by means of capacitors. The frequency dependence is produced by the voltage drop across the resistor, since at high frequencies the current through the transistor increases. The voltage across the resistor increases, and at the input of the amplifier stage the operating point is influenced in the desired way.

The controlled variable is provided in particular by the (physically dependent) power loss of the transistor of the emitter follower increasing with the frequency. There is in addition the possibility of obtaining the controlled variable at a linear input of the amplifier stage.

This controlling of the operating point permits a greater modulation of the amplifier stages, in particular at high frequencies, and reduces the power consumption when these more demanding requirements do not arise. A distortion-free display of video signals with a large proportion of high frequencies, in particular on screens of cathode-ray tubes, is possible with little outlay on components. These and other aspects of the invention will be described below with reference to the accompanying Drawings.

DETAILED DESCRIPTION OF THE DRAWINGS

Figure 1:
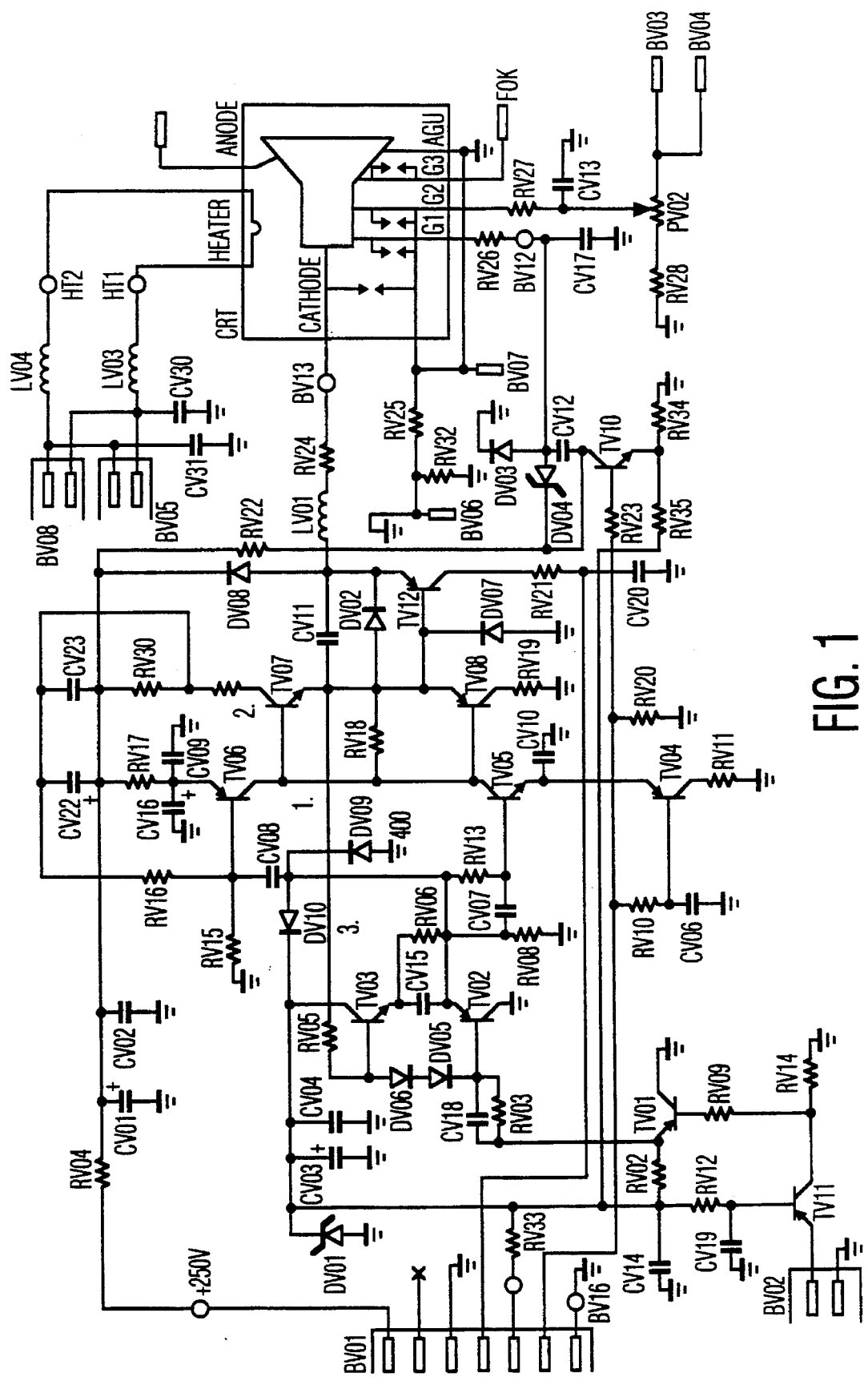
FIG. 1 shows an embodiment of the invention.

FIG. 1 shows the output video amplifier stage for one color channel of a television receiver or monitor. Power supply voltages for the amplifier stage are provided via a connector BV01. A +250 volt supply voltage is filtered by a low pass filter including A resistor RV04 and capacitors CV01 and CV02. A bias voltage is developed by a network including resistor RV33, a Zener diode DV01 and capacitors CV03 and CV04. A color representative video signal is provided by a connector BV02 and amplified by an amplifier stage comprising transistors TV11 and TV01 and resistors RV02, RV09 and RV14. Bias and operating voltages for the latter amplifier stage are via a filter network including resistor RV12 and capacitors CV14 and CV19. The amplified video signal is coupled to another amplifier including transistors TV03 and TV02 and resistors RV06 and RV08 and capacitor CV15 arranged in push-pull configuration via an input network including a resistor RV03 and a capacitor CV18. Diodes DV05 and DV06 are included in a input bias network. The output of the first mentioned push-pull amplifier is coupled to the input of a second push-pull amplifier including transistors TV05 and TV06 via network including resistor RV13 and capacitor CV07. The output of the second push-pull amplifier is coupled to an emitter follower including TV07 and another emitter follower including TV08. The outputs of the latter emitter followers including transistors TV07 and TV08 are coupled to the cathode of a picture tube via a diode DV02 and an emitter follower including a transistor TV12. Transistor TV12 also comprises a current sensing network which is coupled back to a portion of the signal processing section which perform an automatic picture bias setting function as is well known in the art. The outputs of the latter emitter followers including transistors TV07 and TV08 are also coupled back to the input of transistor TV03 of the first push-pull amplifier via a resistor RV05. Various picture tube operating voltages are coupled to the heater and grids of the picture tube.

In summary, the video output stage includes a push-pull driver 1 including the transistors TV06 and TV05, as well as the emitter follower 2 including the transistor TV07 and the predriver stage 3 including the transistor TV03. The overall amplification is determined by a negative voltage feedback in the usual manner due to the ratio of the resistors RV03 and RV05. In operation, the transistor TV05 receives from the transistor TV03 both the a.c. and d.c. portions of the output voltage of transistor TV03, whereas the transistor TV06 receives only the a.c. portion of the output voltage. The circuit takes the controlled variable from the transistor TV07 of the emitter follower 2, from the current path of the latter. The frequency dependence in the form of a controlled variable is produced by the voltage drop across the resistor RV30 in the collector circuit of transistor TV07, since at high frequencies the reactive current of the transistor increases as a physically dependent consequence of its operation. The voltage consequently increases, and at the input of the amplifier stage 1 the operating point is influenced in the desired way as follows. The capacitor CV23 serves as a filter and the capacitor CV22 serves as a rectifier for the voltage developed across resistor RV30. That means that they suppress the high frequency and video components and the resulting voltage is fed to the transistor TV06 via the resistor RV16. The basic bias setting is performed by means of the resistors RV15 and RV16. This setting may be chosen to be very economical in the current drawn. The quiescent current is determined furthermore by the transistor TV07 and the load is determined by the resistor RV05.

Figure 2:
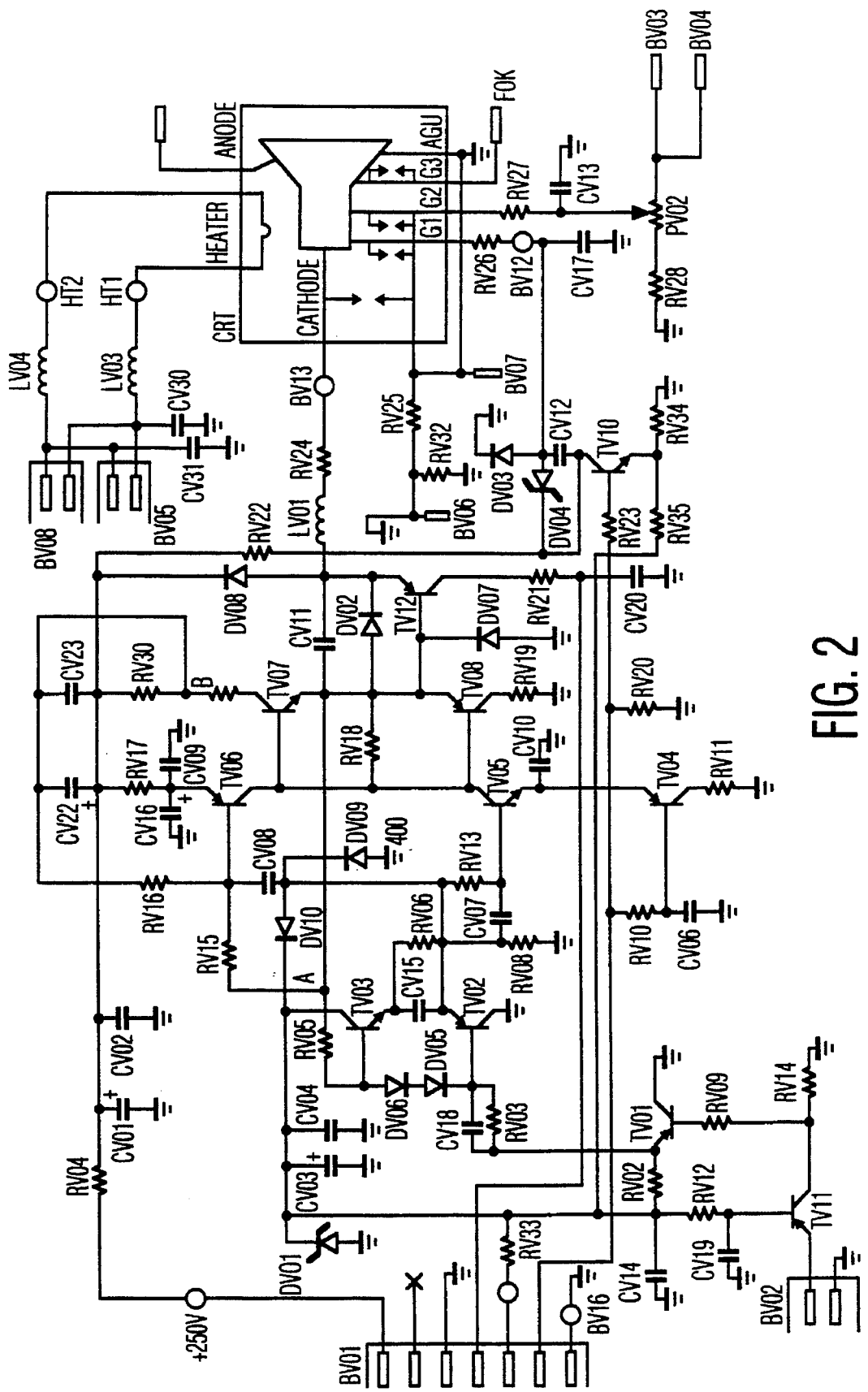
FIG. 2 shows a further embodiment of the invention.

FIG. 2 shows a further exemplary embodiment of the invention. To compensate for the influence of the resistor RV05, an additional control is possible by means of RV16. If the brightness controller were used to run the signal voltage over the full d.c. range, a voltage drop would be produced across the resistor RV30 without a high frequency contribution, and the control would load the resistor RV05 and the transistor TV07. This is avoided by the resistor RV15 being connected via the point A to the resistor RV05. If the d.c. voltage then increases at point A, this is additionally evaluated as a control component from the base of the transistor TV06. If the d.c. voltage increases without the presence of a high frequency component, it is avoided that the operating current becomes too great.

Figure 3:
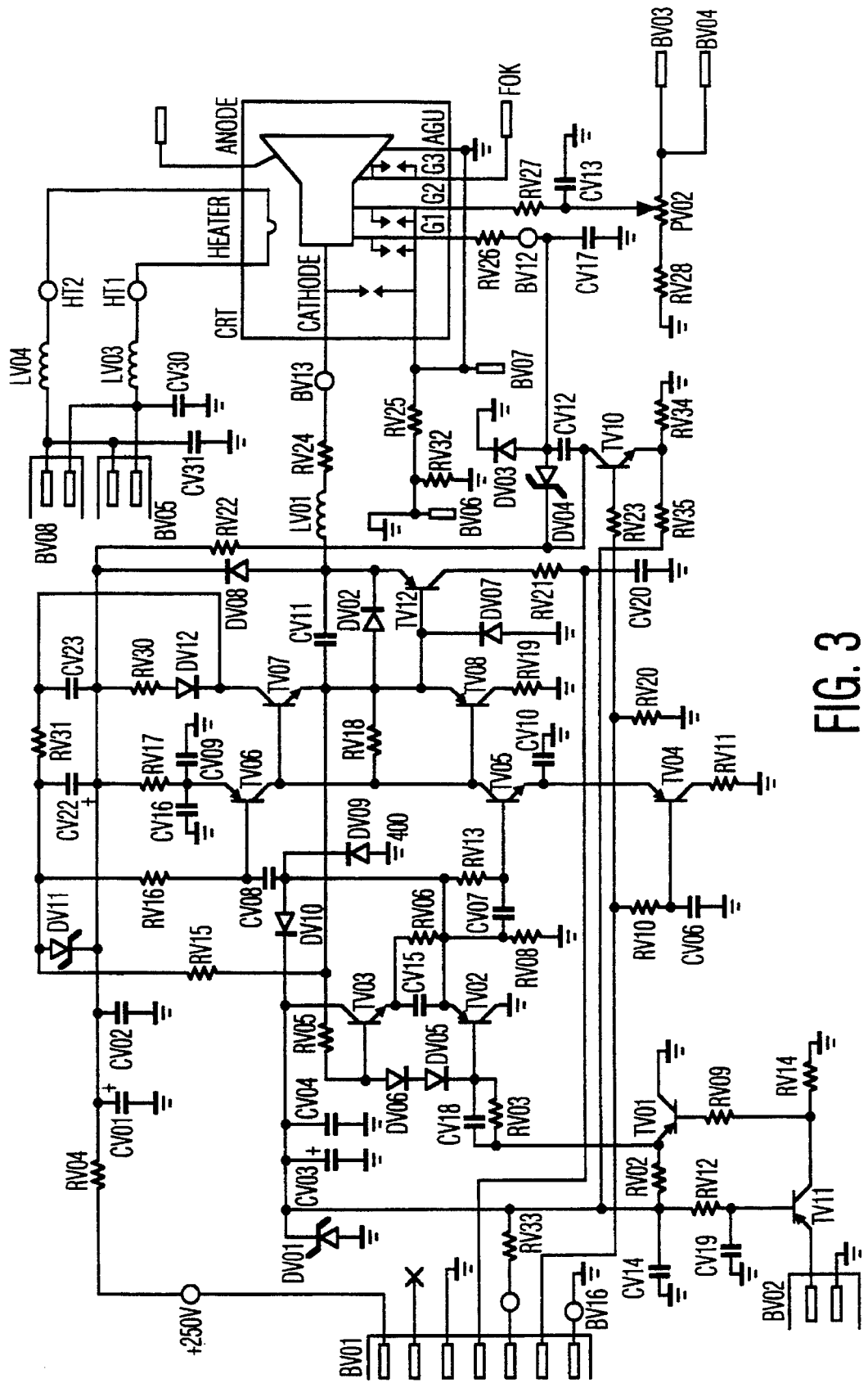
FIG. 3 shows a further embodiment of the invention.

FIG. 3 shows a further exemplary embodiment of the invention. This exemplary embodiment has as a protective measure a diode DV11, in order that the transistor TV06 does not receive an excessive base current if the resistors RV30 and/or RV31 are removed. Furthermore, the diode DV11 also protects against an excessive increase in the control voltage at the amplifier stage. The diode DV12 serves for compensation of the base-emitter diode of the transistor TV06, in particular for temperature compensation. The resistor RV31 serves for intensification of the filtering of the capacitor CV22.

Figure 4:
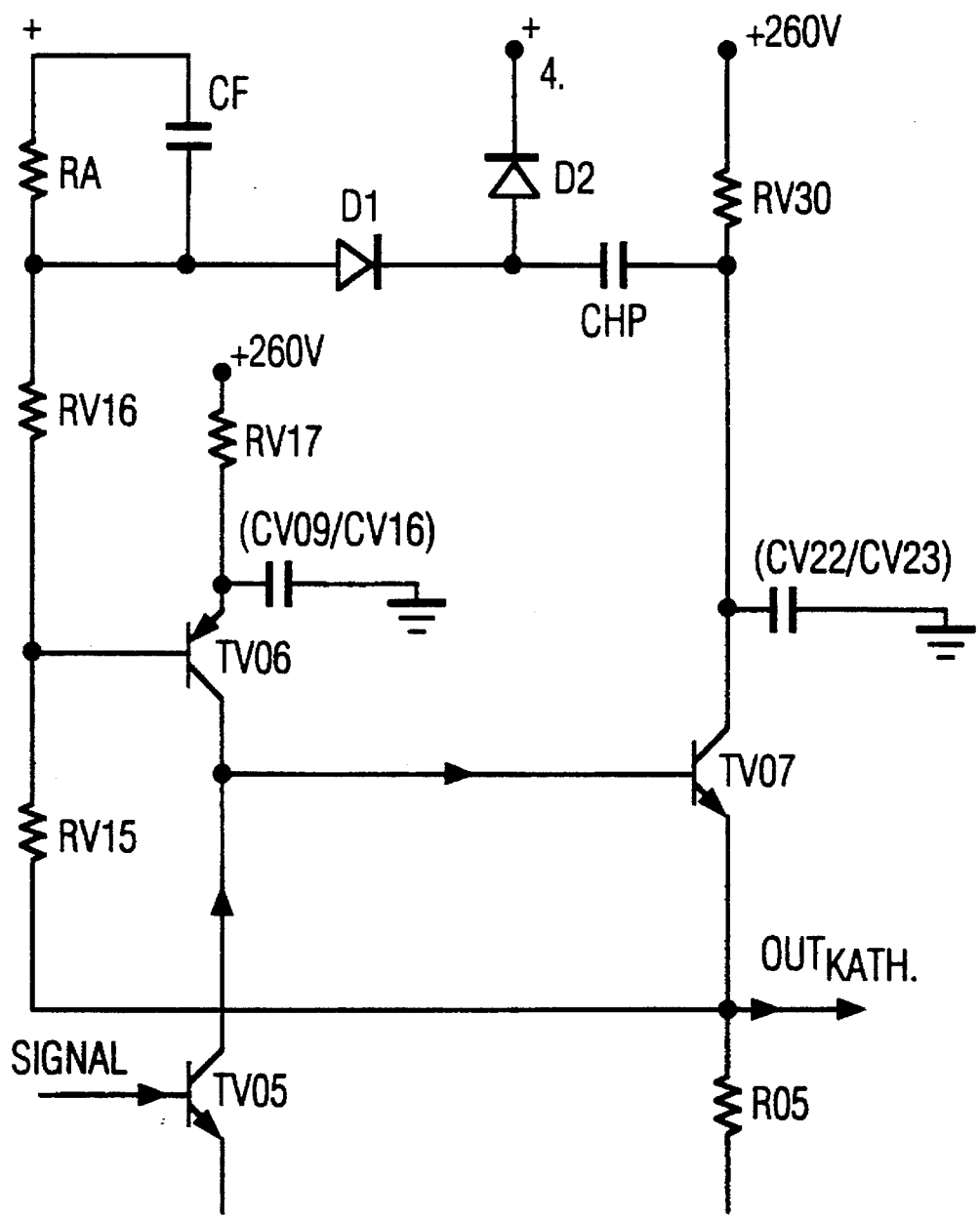
FIG. 4 shows a further embodiment of the invention.

FIG. 4 shows a simplified equivalent circuit diagram of a further embodiment. The voltage picked off across the resistor RV30 is passed on via the high-pass filter 4 and the resistor RV16 to the transistor TV06. The transistor TV06 is in turn connected to the emitter follower TV07. The high-pass filter comprises the capacitor CHP, the diodes D1, D2, the filter capacitor CF and the load resistor RA. If a higher signal current is required on account of the increasing frequency, an increasing of the signal current can be performed on account of the return via the high-pass filter 4 to the base of the transistor TV06.

Figure 5A:
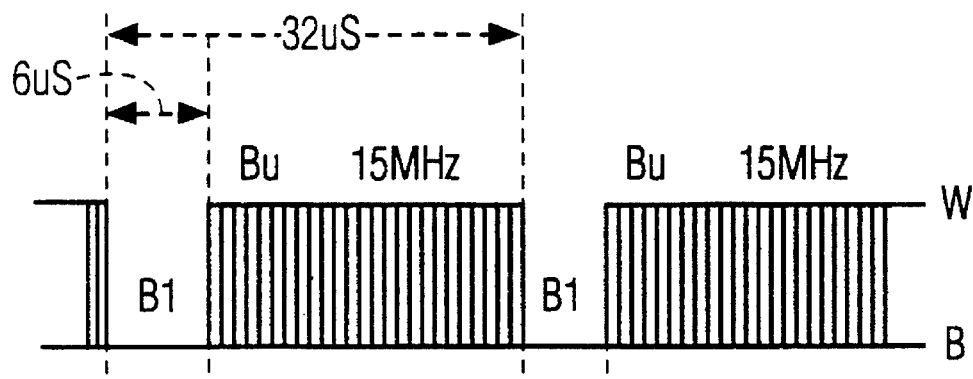
FIGS. 5A, 5B, and 5C shows graphical representations of video signals useful in understanding the invention.
Figure 5B:
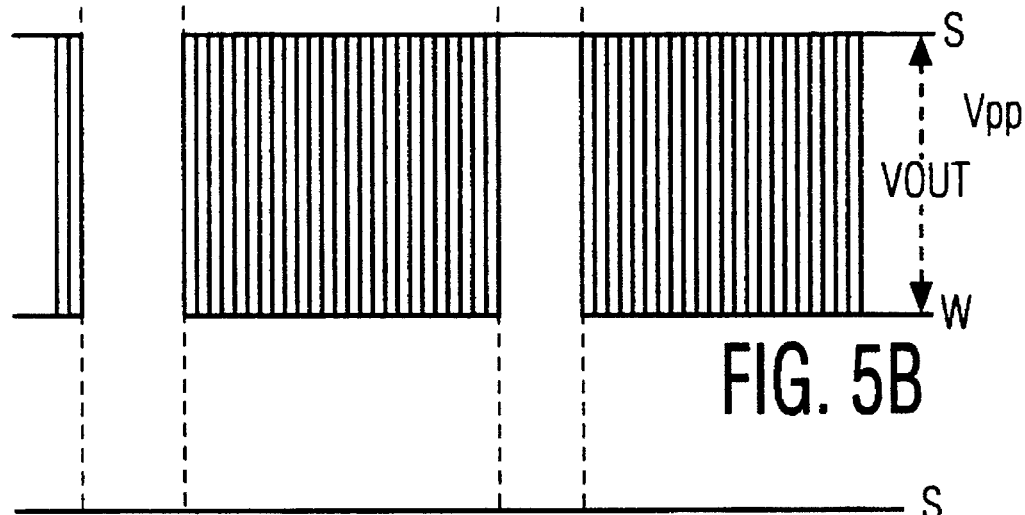
Figure 5C:
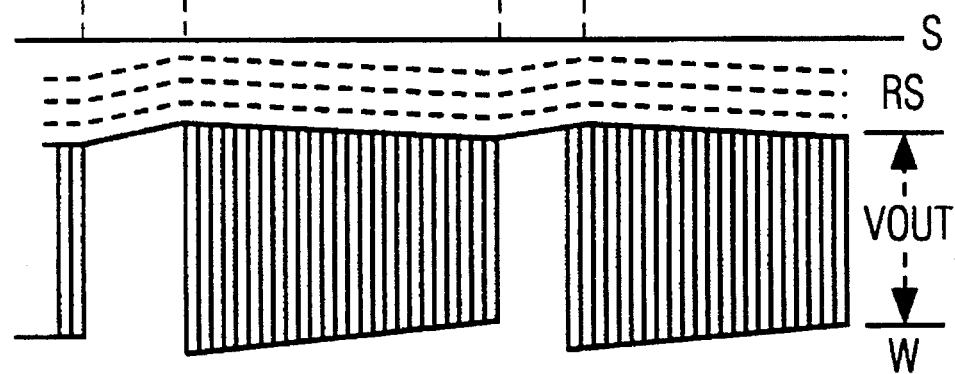

FIGS. 5A, 5B, and 5C shows graphical representations of in the case of a video input signal of 15 MHz. FIG. 5A represents the video input signal at the transistor TV01 with the characteristics white W, black B, burst Bu and blanking B1. FIG. 5B represents the video output signal VOUT at the cathode connector BV13 of the picture tube socket with the control provided by the present invention. With control, the output signal has a maximum value of 230 Vpp. The maximum current requirement with control is 120 mA. FIG. 5C represents the video output signal VOUT at BV13 without control, the return signals RS not being adequately blanked. The maximum output signal VOUT is limited and distorted. Without control, the output signal has a maximum value of 50 Vpp. The maximum current requirement without control is about 60 mA. The same overall quiescent current of the output stage of 13 mA at the operating voltage +250 volts applies for both values, with or without control. That corresponds to a power of 3.25 watts. The maximum current requirement without control is about 60 mA and with control is 120 mA. Since the higher values occur only briefly, the overall situation is positive with respect to outlay and power consumption.

Each transistor has a transition frequency, at which the amplification of high frequency (HF) reaches the value 1. The absolute limit of this transistor with respect to HF amplification is then reached. This value "1" is also referred to as the "gain bandwidth product". At the operating point of the maximum transition frequency, a transistor can also deliver the highest peak output level for high frequency. This operating point is associated with a higher current consumption. In the characteristic shown in FIG. 6, this higher current consumption is represented by the change from the operating point AP1 to the operating point AP2 due to the increasing of the current $I_c$. For the design of the amplifier it is very important whether it is operated with a power loss of 1 W or 10 W, since the cooling surfaces, the high-frequency channel and the mains power unit have to be of a larger design.

Figure 6:
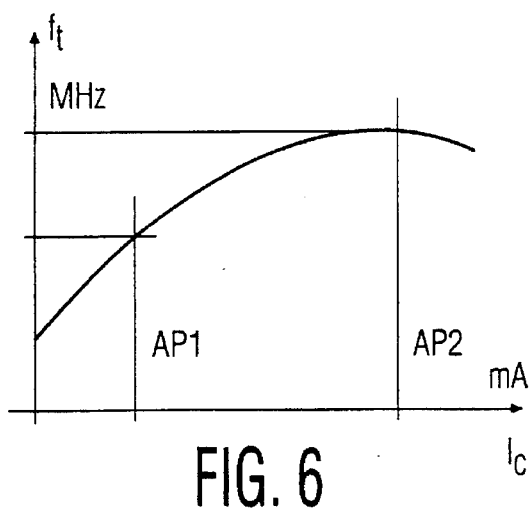
FIG. 6 shows a response characteristic useful in understanding the invention.
Figure 7:
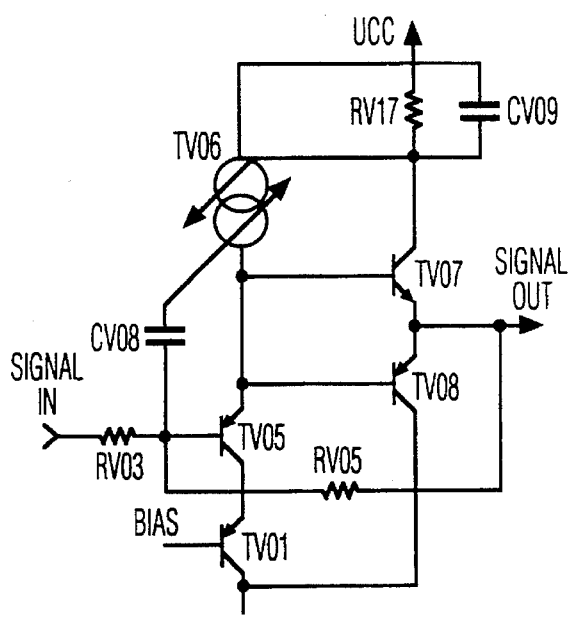
FIG. 7 shows a further embodiment of the invention.

FIG. 7 shows a further development of the invention. The amplification is determined by a negative voltage feedback in the usual sense due to the ratio of the resistors RV03 and RV05. The voltage amplification of the circuit is governed by the transistors TV05 and TV06. In FIG. 7, the transistor TV06 is represented here as a controlled current source. Transistor TV06 acts as a load resistance for the transistor TV05 and ensures a high amplification factor. The high frequency is fed via the capacitor CV08. The increasing of the transition frequency of the transistors TV06 and TV05 takes place due to the d.c. voltage which occurs across the resistor RV17 and CV09. The collector current of the transistor TV06 is increased and consequently so too is the transition frequency. As represented in FIG. 6, the operating point AP1 shifts to the operating point AP2. Depending on demand, there are also intermediate values. In order to maintain symmetrical driving, the correct operating point for the transistor TV05 is then reset by means of the resistors RV05 and RV03. The transistor TV05 then operates in the same way with a higher current. Consequently, its transition frequency has then also been increased. Usually complementary types are used for the transistors TV05 and TV06. Consequently, the d.c. voltage amplification is symmetrical and high up to the highest frequencies. As a result, the designing of the cooling and of the mains power unit can be simplified.

If the high-frequency operating point is improved by increasing the current in the transistor stages TV05 and TV06, this simultaneously ensures stabilization of the circuit. The transistor TV07 then only continues to supply control current if it is offered sufficient high frequency. This ensures that it does not become possible to over-control the overall circuit. If the transistor TV06, and consequently also the transistor TV05, is opened beyond the optimum, the high-frequency amplitude drops again, and the control current no longer increases. Therefore, this circuit remains automatically at the maximum value or the optimum for high frequency. Increases in d.c. voltage are corrected by means of negative-feedback resistors RV03 and RV05. Consequently, only operation between the compromise minimum for the video signal and the high-frequency optimum is possible.

Figure 8A:
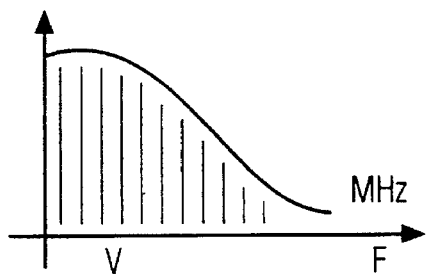
FIGS. 8A and 8B shows graphical representations of video signals useful in understanding the invention.
Figure 8B:
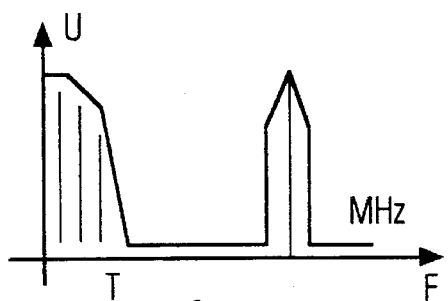

FIGS. 8A and 8B show that the frequency spectrum in the upper range is really only driven to high output levels in the case of particular signals. FIG. 8A shows the video signal V and FIG. 8B shows the test signal T.

Figure 9:
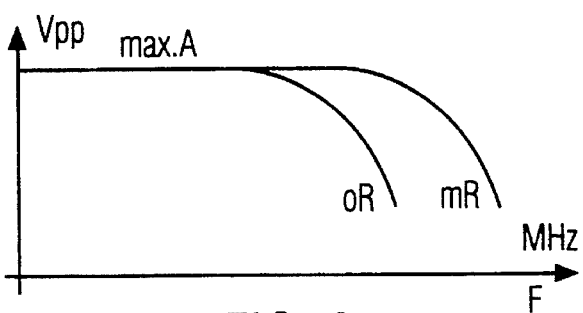
FIG. 9 shows a response characteristic useful in understanding the invention.

The improvement in modulation is represented in FIG. 9. The maximum output voltage (max. A) is represented in dependence on the frequency F in the case without control oR and with control mR.

The following components were used in the case of a circuit tested:

| | | |
|---|---|---|
| TV03 | BF 763 | |
| TV05 | 2SC3790 | |
| TV06 | 2SA1480 | |
| TV07 | 2SC3790 | |
| DV11 | ZPY6.2 | |
| DV12 | IN4004 | |
| RV03 | 820 ohm | |
| RV05 | 33 Kohm | |
| RV15 | 150 Kohm/180 Kohm | |
| RV16 | 1 Kohm | |
| RV17 | 100 ohm | |
| RV30 | 150 ohm | |
| RV31 | 1 Kohm | |
| CV09 | 10 nanofarad (nF) | |
| CV16 | 4.7 microF | |
| CV22 | 47 microF | |
| CV23 | 10 nF | |

I claim:
1. Apparatus comprising:

an amplifier having an input and an output;

a source of an input video signal coupled to said input of said amplifier; said video signal having trace intervals in which picture information is present and retrace intervals in which video information is not present;

means for coupling said output of said amplifier to a load;

a source of a bias signal coupled to said input of said amplifier;

said amplifier including a first transistor having a first-input electrode, a second-output electrode and a third electrode, and arranged in a follower configuration; said first-input electrode being coupled to said input of said amplifier; said second-output electrode being coupled to said output of said amplifier; and said third electrode being coupled to a power supply terminal;

a sensing element connected between said third electrode of said first transistor and said power supply terminal; and a feedback network, including a filter capacitor for developing a DC signal indicative of the current supplied by said amplifier to said load in response to said picture information represented by said video signal during said trace intervals, coupled between said sensing element and said source of said bias signal for modifying said bias signal as a function of said current.

2. The apparatus recited in claim 1 wherein:

said amplifier also includes a second transistor of the complementary type with respect to said first transistor, said second transistor also having a first-input electrode, a second-output electrode and a third electrode, and also being arranged in a follower configuration; said first and second transistors being arranged in a push-pull configuration; said first-input electrodes of said first and second transistors being coupled together to said input of said amplifier; said second-output electrodes of said first and second transistors being coupled together to said output of said amplifier; and said third electrodes of said first and second transistors being coupled to respective power supply terminals;

a rectified version of said current supplied by said amplifier to said load being developed across said sensing element in response to said picture information represented by said video signal during said trace interval by virtue of the push-pull operation of said amplifier; and said feedback network not containing any rectifying elements for developing said rectified version of said current supplied by said amplifier to said load.

3. The apparatus recited in claim 2 wherein:

said first and second transistors are bipolar transistors having respective base, emitter and collector electrodes; said first-input electrodes are respective base electrodes; said second-output electrodes are respective emitter electrodes; and said third electrodes are respective collector electrodes.

4. The apparatus recited in claim 3 wherein:

said load is a picture tube and said output of said amplifier is coupled to a cathode of said picture tube.

* * * * *